United States Patent
Johnson et al.

(10) Patent No.: US 6,525,371 B2
(45) Date of Patent: *Feb. 25, 2003

(54) SELF-ALIGNED NON-VOLATILE RANDOM ACCESS MEMORY CELL AND PROCESS TO MAKE THE SAME

(75) Inventors: Jeffrey B. Johnson, Essex Junction, VT (US); Chung H. Lam, Williston, VT (US); Dana Lee, Santa Clara, CA (US); Dale W. Martin, Hyde Park, VT (US); Jed H. Rankin, Burlington, VT (US)

(73) Assignees: International Business Machines Corporation, Armonk, NY (US); Silicon Storage Technologies, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/401,622

(22) Filed: Sep. 22, 1999

(65) Prior Publication Data

US 2002/0109179 A1 Aug. 15, 2002

(51) Int. Cl.[7] .............................................. H01L 29/788
(52) U.S. Cl. ........................ 257/317; 257/315; 257/321; 438/260
(58) Field of Search ................................ 257/315, 317, 257/321, 320; 438/257, 260, 267

(56) References Cited

U.S. PATENT DOCUMENTS

| | | | |
|---|---|---|---|
| 4,757,360 A | 7/1988 | Faraone | 257/317 |
| 4,794,565 A | 12/1988 | Wu et al. | 365/185.15 |
| 4,882,707 A | 11/1989 | Mizutani | 365/185.12 |
| 4,931,847 A | 6/1990 | Corda | 365/185.28 |
| 4,947,221 A | 8/1990 | Stewart et al. | 257/316 |
| 5,021,848 A | 6/1991 | Chiu | 257/317 |
| 5,041,886 A | 8/1991 | Lee | 257/320 |
| 5,101,250 A | 3/1992 | Arima et al. | 365/185.12 |
| 5,268,319 A | 12/1993 | Harari | 438/260 |
| 5,422,504 A * | 6/1995 | Chang et al. | 257/316 |
| 5,429,965 A | 7/1995 | Shimoji | 438/287 |
| 5,492,846 A * | 2/1996 | Hara | 438/260 |
| 5,494,838 A * | 2/1996 | Chang et al. | 438/264 |
| 5,544,103 A | 8/1996 | Lambertson | 365/185.15 |
| 5,652,161 A * | 7/1997 | Ahn | 438/264 |

(List continued on next page.)

FOREIGN PATENT DOCUMENTS

| | | | | |
|---|---|---|---|---|
| EP | 0 389 721 A2 | | 10/1990 | |
| JP | 4-08-204034 | * | 8/1996 | ....... H01L/21/8247 |
| JP | 4-09-307007 | * | 11/1997 | ....... H01L/21/8247 |

*Primary Examiner*—George C. Eckert, II
(74) *Attorney, Agent, or Firm*—McGinn & Gibb, PLLC; Mark F. Chadurjian, Esq.

(57) ABSTRACT

A self aligned method of forming a semiconductor memory array of floating gate memory cells in a semiconductor substrate has a plurality of spaced apart isolation regions on the substrate substantially parallel to one another. An active region is between each pair of adjacent isolation regions. The active and isolation regions are formed in parallel and in the column direction. In the row direction, strips of spaced apart silicon nitride are formed. A source line plug is formed between adjacent pairs of silicon nitride and is in contact with a first region in the active regions, and the isolation regions. The strips of silicon nitride are removed and isotropically etched. In addition, the materials beneath the silicon nitride are also isotropically etched. Polysilicon spacers are then formed in the row direction parallel to the source line plug and adjacent to the floating gates to form connected control gates. A second region is formed between adjacent, spaced apart, control gates. A bit line is formed in the bit line direction contacting the second region in the space between the control gates.

19 Claims, 14 Drawing Sheets

U.S. PATENT DOCUMENTS

| | | | |
|---|---|---|---|
| 5,780,341 A | 7/1998 | Ogura | 438/259 |
| 5,780,892 A | 7/1998 | Chen | 257/317 |
| 5,789,293 A | 8/1998 | Cho et al. | 438/257 |
| 5,808,328 A | 9/1998 | Nishizawa | 257/264 |
| 5,811,853 A | 9/1998 | Wang | 257/316 |
| 5,814,853 A | 9/1998 | Chen | 257/315 |
| 5,858,840 A * | 1/1999 | Hsieh et al. | 438/266 |
| 5,915,178 A * | 6/1999 | Chiang et al. | 438/266 |
| 5,939,749 A * | 8/1999 | Taketa et al. | 257/316 |
| 5,950,087 A * | 9/1999 | Hsieh et al. | 438/264 |
| 5,970,371 A * | 10/1999 | Hsieh et al. | 438/593 |
| 5,972,753 A * | 10/1999 | Lin et al. | 438/265 |
| 6,001,690 A * | 12/1999 | Chien et al. | 438/266 |
| 6,017,795 A * | 1/2000 | Hsieh et al. | 438/262 |
| 6,074,914 A * | 6/2000 | Ogura | 438/257 |
| 6,090,668 A * | 7/2000 | Lin et al. | 438/266 |
| 6,103,573 A | 8/2000 | Harari et al. | 438/257 |
| 6,133,097 A * | 10/2000 | Hsieh et al. | 438/266 |
| 6,133,098 A * | 10/2000 | Ogura et al. | 438/267 |
| 6,165,845 A * | 12/2000 | Hsieh et al. | 438/260 |
| 6,174,771 B1 * | 1/2001 | Leu | 438/257 |
| 6,200,860 B1 * | 3/2001 | Chiang et al. | 438/266 |
| 6,228,695 B1 * | 5/2001 | Hsieh et al. | 438/201 |
| 6,229,176 B1 * | 5/2001 | Hsieh et al. | 257/316 |

* cited by examiner

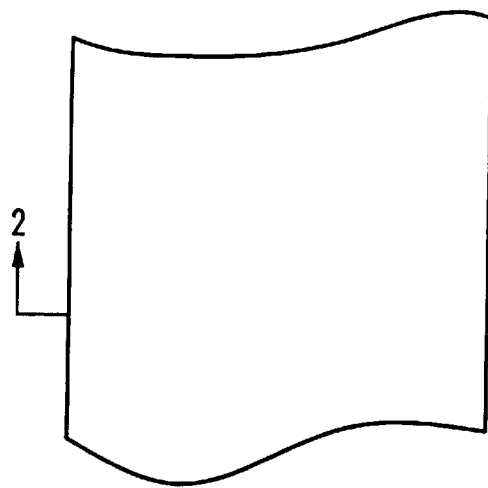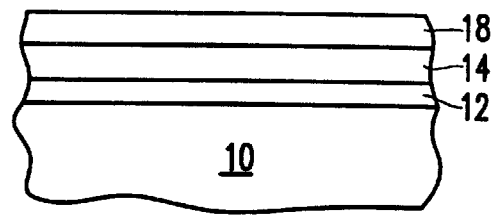
FIG.37A-1    FIG.37A-2
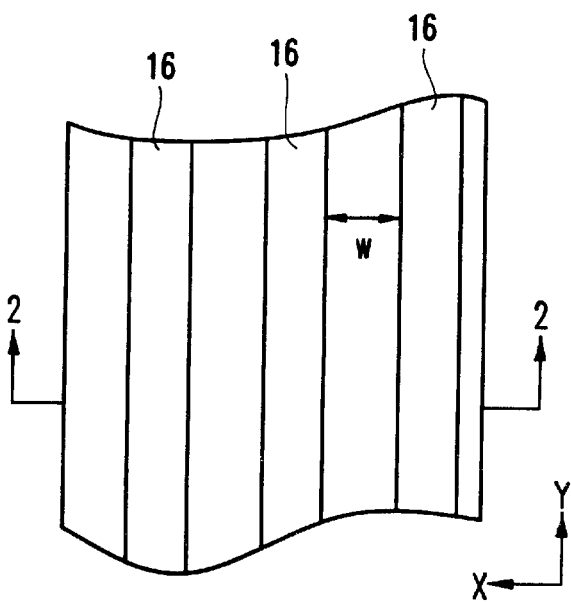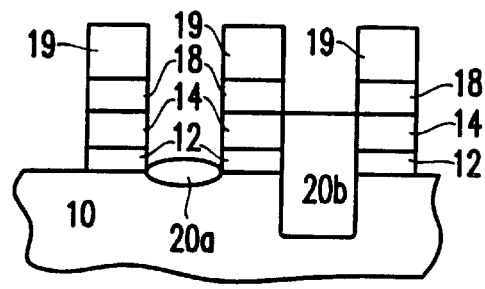
FIG.37B-1    FIG.37B-2

SELF-ALIGNED NON-VOLATILE RANDOM ACCESS MEMORY CELL AND PROCESS TO MAKE THE SAME

BACKGROUND OF THE INVENTION

1. Field of the Invention

The present invention generally relates to a self-aligned non-volatile memory and method of manufacture and more particularly relates to a triple-self-aligned split gate non-volatile random access memory (NVRAM) cell.

2. Description of the Related Art

Non-volatile semiconductor memory cell using a floating gate to store charges thereon and memory arrays of such non-volatile memory cells formed in a semiconductor substrate are well known in the art. Typically, such floating gate memory cells have been of the split gate type, or stacked gate type, or a combination thereof.

One of the problems facing the manufacturability of semiconductor floating gate memory cell arrays has been the alignment of the various components such as source, drain, control gate, and floating gate. As the scale of integration of semiconductor processing increases, reducing the largest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing.

SUMMARY OF THE INVENTION

In view of the foregoing and other problems of the conventional methods and processes, an object of this invention is to achieve the manufacturing of a semiconductor memory array of a floating gate memory cell array.

It is also an object of the present invention to provide a non-volatile RAM cell including a plurality of polysilicon floating gates, each having a sharp tip, a first side, a top side and a second side. The sharp tip of the floating gate may be formed at a junction of the top side and the second side. An insulator spacer may be provided on a portion of the top side and on the first side of each of the floating gates. A self-aligned contact (i.e., such as a polysilicon source line contact plug) may be provided between adjacent floating gates. A dielectric material may be provided on another portion of the top side, on the sharp tip and on the second side of each of the floating gates. A polysilicon wordline spacer may also be provided on one side of the insulator spacer and over the dielectric material.

In the present invention, self-aligned methods are disclosed to form a semiconductor memory array of floating gate memory cells of the split gate type as well as such memory arrays formed thereby. In the self aligned method of the present invention, the memory cell may have a first terminal, a second terminal with a channel between the first terminal and the second terminal, a floating gate, and a control gate. A plurality of spaced isolation regions may be formed in the substrate. The isolation regions may be substantially parallel to one another in a first direction with an active region between each pair of adjacent isolation regions. Each active region may have a first layer of insulating material on the semiconductor substrate, and a first layer of polysilicon material on the first layer of the insulating material. A plurality of spaced apart masking regions of a masking material are formed substantially parallel to one another on the semiconductor substrate in a second direction crossing a plurality of alternating active regions and isolation regions. The second direction may be substantially perpendicular to the first direction. A plurality of spaced apart first spacers of an insulating material may be formed substantially parallel to one another in the second direction. Each of the first spacers may be adjacent to and contiguous with one of the masking regions with a first region between each pair of adjacent first spacers. Each first spacer may cross a plurality of alternating active regions and isolation regions. The material may be etched between each pair of adjacent first spacers in the first region. A first terminal may be formed in the substrate in the active region between pairs of adjacent first spacers in the first region. A conductor may be formed in the second direction between each pair of spaced apart first spacers, electrically connected to the first terminal in the substrate.

The masking material may be removed resulting in a plurality of spaced apart structures substantially parallel to one another in the second direction. An insulating film may be formed about each of these structures. A plurality of spaced apart second spacers of polysilicon material substantially parallel to one another may be formed in the second direction. Each second spacer may be adjacent to and contiguous with one of the structures. A second region may be between each pair of adjacent second spacers with each second spacer crossing a plurality of alternating active regions and isolation regions. Each of the second spacers may electrically connect the control gates for the memory cells in the second direction. Between each pair of adjacent second spacers in the second region, the material may be etched. A second terminal may be formed in the substrate in each of the active regions between pairs of adjacent second spacers in the second region. Finally, a conductor may be formed in a first direction substantially parallel to an active region and electrically connected to the second terminals in the first direction.

Other objects, advantages and salient features of the invention will become apparent from the following detailed description taken in conjunction with the annexed drawings, which disclose preferred embodiments of the invention.

BRIEF DESCRIPTION OF THE DRAWINGS

The invention will be described in detail with reference to the following drawings in which like reference numerals refer to like elements and wherein:

FIG. 37a-1 is a top view of a semiconductor substrate used in the first step of the method according to one embodiment of the present invention to form isolation regions;

FIG. 37a-2 is a cross sectional view taken along the line 2—2;

FIG. 37b-1 is a top view of the next step in the processing of the structure of FIG. 37a-1, in which isolation regions are formed;

FIG. 37b-2 is a cross sectional view taken along the line 2—2 showing the two types of isolation regions that can be formed in the semiconductor substrate: LOCOS or shallow trench;

FIG. 37c-1 is a top view showing the next step in the processing of the structure shown in FIG. 37b-1 to form isolation regions;

FIG. 37c-3 is a cross sectional view taken along the line 3—3;

FIG. 37c-4 is a cross sectional view taken along the line 4—4;

FIG. 38a-4 is a cross sectional view taken along the line 4—4 in the next step in the processing of the structure shown in FIG. 37c-1, in the formation of non-volatile memory array of floating memory cells of the split gate type;

FIG. 38b-4 is a cross sectional view taken along the line 4—4 in the next step in the processing of the structure shown in FIG. 38a-4, in the formation of non-volatile memory array of floating memory cells of the split gate type;

FIG. 38c-4 is a cross sectional view taken along the line 4—4 in the next step in the processing of the structure shown in FIG. 38b-4, in the formation of non-volatile memory array of floating memory cells of the split gate type;

FIG. 38d-4 is a cross sectional view taken along the line 4—4 in the next step in the processing of the structure shown in FIG. 38c-4, in the formation of non-volatile memory array of floating memory cells of the split gate type;

FIG. 38e-4 is a cross sectional view taken along the line 4—4 in the next step in the processing of the structure shown in FIG. 38d-4, in the formation of non-volatile memory array of floating memory cells of the split gate type;

FIG. 38f-4 is a cross sectional view taken along the line 4—4 in the next step in the processing of the structure shown in FIG. 38e-4, in the formation of non-volatile memory array of floating memory cells of the split gate type;

FIG. 38g-4 is a cross sectional view taken along the line 4—4 in the next step in the processing of the structure shown in FIG. 38f-4, in the formation of non-volatile memory array of floating memory cells of the split gate type;

FIG. 38h-4 is a cross sectional view taken along the line 4—4 in the next step in the processing of the structure shown in FIG. 38g-4, in the formation of non-volatile memory array of floating memory cells of the split gate type;

FIG. 38i-4 is a cross sectional view taken along the line 4—4 in the next step in the processing of the structure shown in FIG. 38h-4, in the formation of non-volatile memory array of floating memory cells of the split gate type; and FIG. 38j-1 is a top view showing the interconnection of row lines and bit lines to terminals in active regions in the formation of the non-volatile memory array of floating memory cells of the split gate type.

DETAILED DESCRIPTION OF PREFERRED EMBODIMENTS OF THE INVENTION

Figure 1:
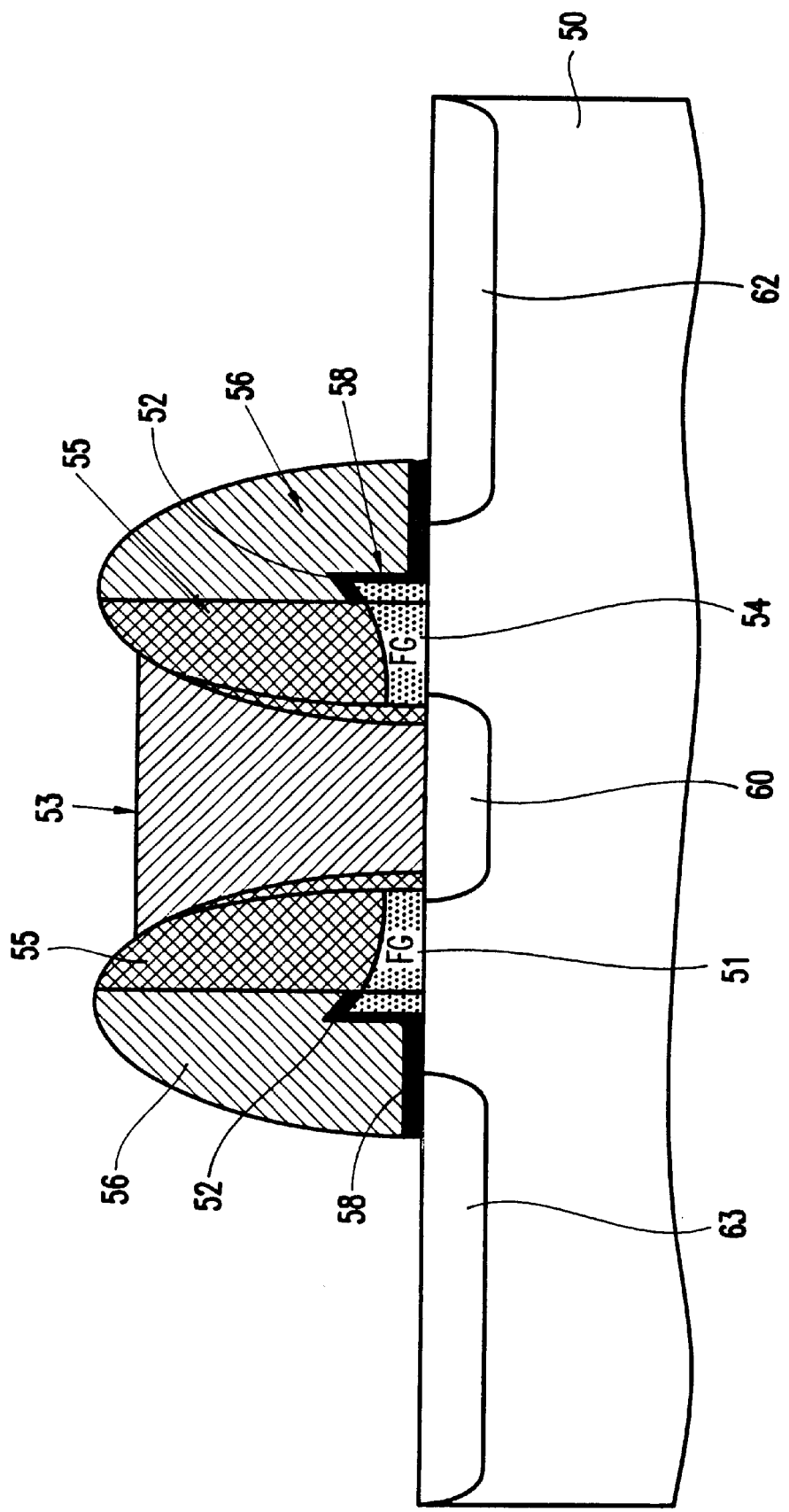
FIG. 1 is a schematic diagram of a self-aligned NVRAM cell with polysilicon spacer wordlines according to the present invention.

FIG. 1 shows the cell structure of a triple self-aligned NVRAM cell according to one embodiment of the present invention. Attributes of this structure include the polysilicon spacer wordline 56 which serves as the source side injection device, the sharp point 52 created by the floating gate (54 which is overlapped by tie dielectric material 58), and the self-aligned polysilicon source line contact 53 to the wordline.

As can clearly be seen in FIG. 1, the NVRAM cell according to one embodiment of the present invention has a unique structure. A silicon substrate 50 is provided having a doped source region 60, a doped bitline/drain region 62 and a doped bitline/drain region 63. A first polysilicon floating gate 51 and a second polysilicon floating gate 54 are provided over the substrate 50 and are both partly overlapping the source region 60. A polysilicon source line contact plug 53 is provided between the floating gates 51 and 54 to provide self-alignment with the floating gates.

The floating gate 54 includes a top side and a right-hand side (as viewed in FIG. 1) that meet at a sharp tip 52. An insulating spacer 55, preferably made of deposited TEOS, is provided over the floating gate 54 and on the left-hand side of the floating gate 54. A dielectric material 58 (i.e., silicon dioxide) may be provided on the sharp tip 52 of the floating gate 54, on the right-hand side of the floating gate 54 and on the substrate 50 extending over the bitline/drain region 62. Additionally, a polysilicon wordline 56 may be provided on the dielectric material 58.

Similarly, the floating gate 51 includes a top side and a left-hand side that meet at a sharp tip 52. An insulating spacer 55, dielectric material 58 and polysilicon wordline 56 are also provided in a similar manner to that provided over the floating gate 54.

Figures 6, 7:
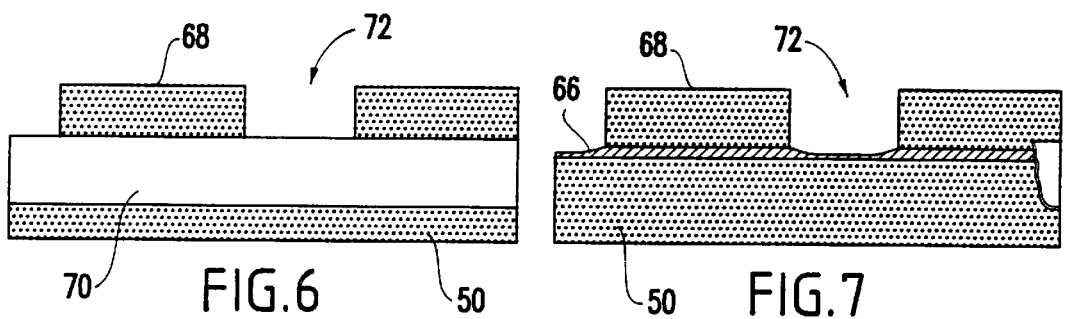
Figure 30:
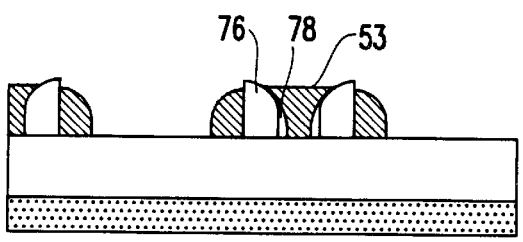

FIGS. 2–31 show steps of forming the NVRAM cell according to one embodiment of the present invention. In these figures, the even-numbered figures (such as FIG. 2, FIG. 4, FIG. 6, . . . FIG. 30) correspond to areas of the isolation region while the odd-numbered figures (such as FIG. 3, FIG. 5, FIG. 7, . . . and FIG. 31) correspond to areas of the active region.

Figures 2, 3:
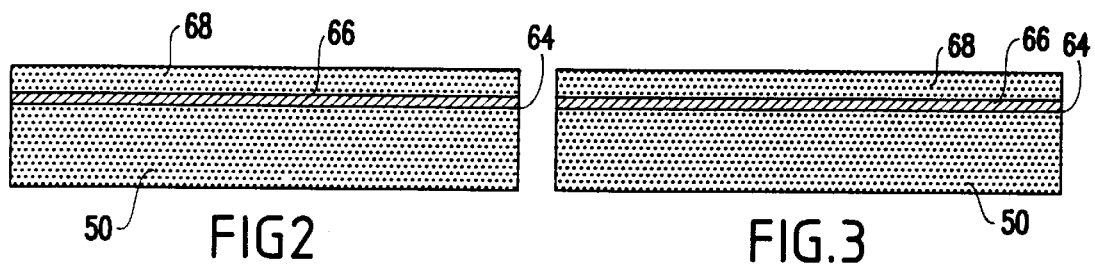
FIGS. 2–31 show one method of manufacturing the NVRAM cell according to the present invention.

As shown in FIGS. 2 and 3, a silicon substrate 50 is initially provided. An oxide layer 64 is formed over the substrate 50, a polysilicon layer 66 is formed over the oxide layer 64 and a nitride layer 68 is formed over the polysilicon layer 66. The polysilicon layer 66 preferably has a thickness of approximately 500–700µ, the oxide layer 64 is preferably 90 Å and the nitride layer 68 is preferably 90Å.

Figures 4, 5:
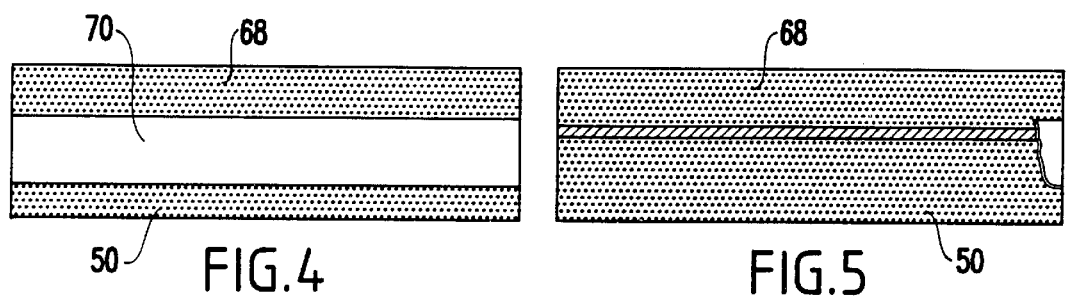

In the isolation region, and as shown in FIG. 4, the oxide layer 64, the polysilicon layer 66, the nitride layer 68 and portions of the substrate 50 are etched using a mask (not shown) to form a shallow trench. An oxide layer 70 is then deposited over the substrate 50 in the isolation region. Further amounts of nitride are then added in the isolation region (FIG. 4) over the oxide layer 70 and the active region (FIG. 5) over the previously deposited nitride layer 68.

Subsequently, a floating gate mask (not shown) is provided over the isolation region and the active region to define the trough. A trough (i.e., floating gate trough) 72 is etched in both regions through the nitride layer 68, stopping on the oxide layer 70 in the isolation region and stopping on the polysilicon layer 66 in the active region.

Figure 8:
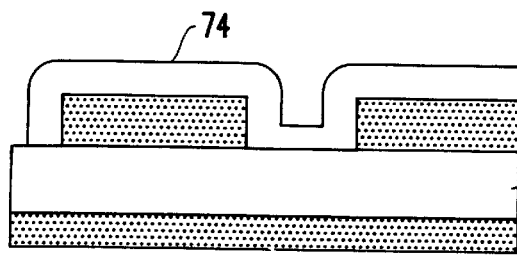
Figure 9:
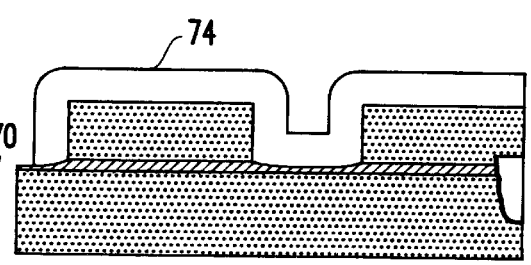
Figure 10:
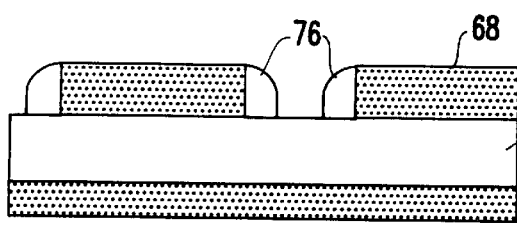
Figure 11:
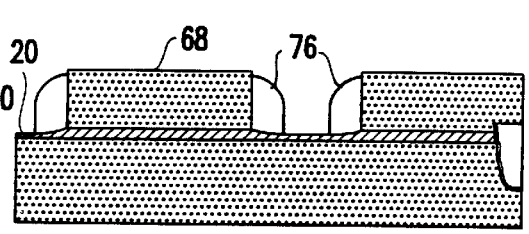

A tetraethylorthosilicate (TEOS) layer 74 is then blanket deposited (about 2000–2500 Å) over the structure in the isolation region and the active region as shown in FIGS. 8 and 9. This TEOS layer 74 is then etched to form spacers 76 using an anisotropic reactive ion etch. The spacers 76 correspond with the insulating spacers 55 shown in FIG. 1 that are provided over the floating gates 51 and 54.

Figure 12:
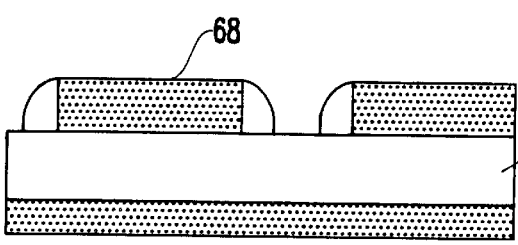
Figure 13:
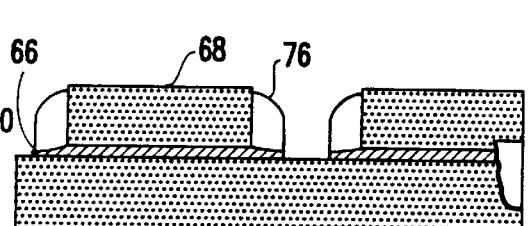

Subsequently, as shown in FIGS. 12 and 13, the polysilicon layer 66 is etched (preferably dry etch) in the active region (FIG. 11) stopping on the oxide layer 64 under the polysilicon layer 66 (FIG. 13).

Figure 14:
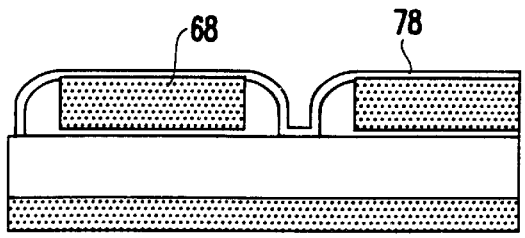
Figure 15:
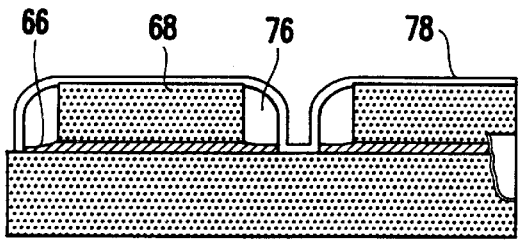
Figure 16:
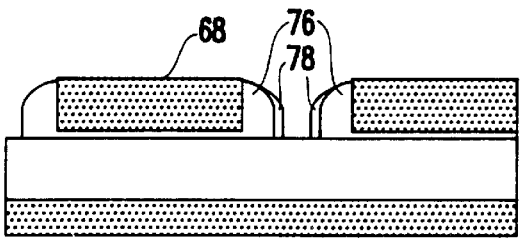
Figure 17:
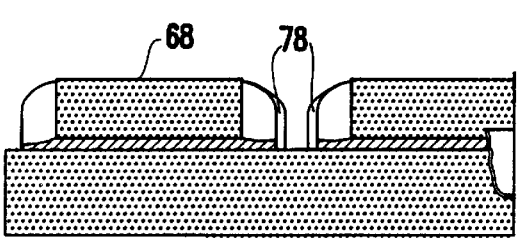
Figure 18:
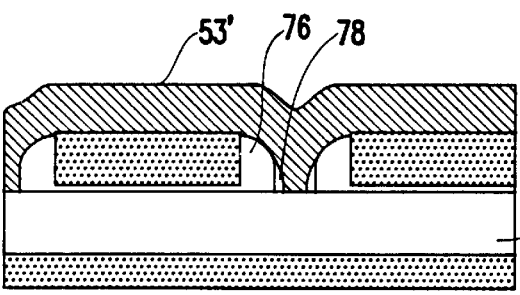
Figure 19:
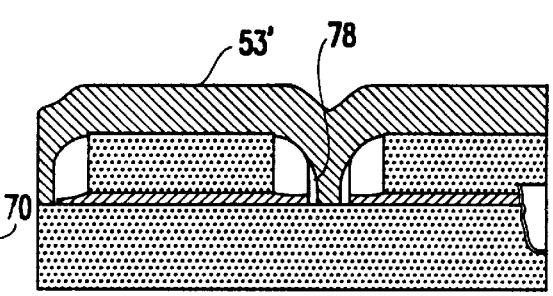
Figure 20:
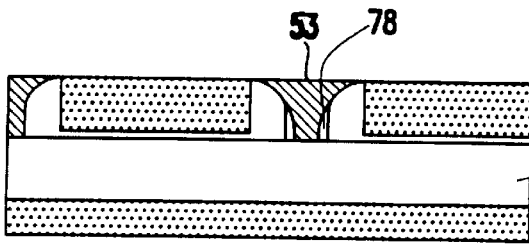
Figure 21:
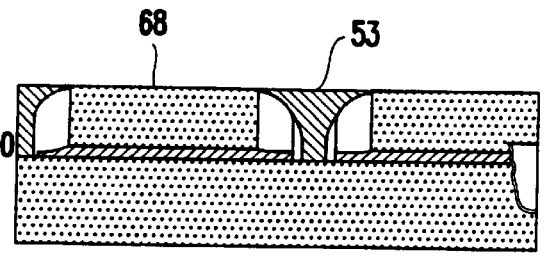

An oxide layer 78 is then deposited (approximately 300 Å) over the structure as shown in FIGS. 14 and 15. This oxide layer 78 is subsequently etched such that the oxide layer 78 is provided only on the side of the spacer 76 as shown in FIGS. 16 and 17. Subsequently, a polysilicon layer 53' is deposited (approximately 3000 Å) over the structure as shown in FIGS. 18 and 19. The polysilicon layer 53' is subsequently polished and planarized as shown in FIGS. 20 and 21. The polysilicon layer 53' corresponds to the polysilicon source line contact plug 53 shown in FIG. 1.

Figure 22:
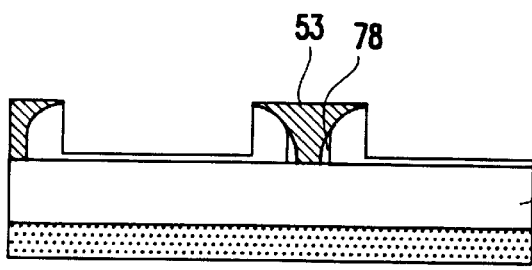
Figure 23:
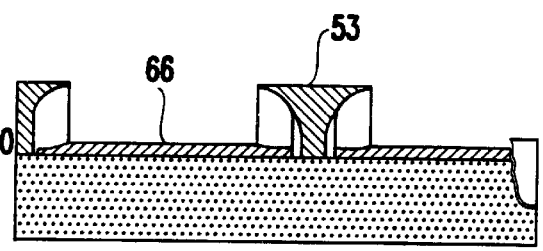
Figure 24:
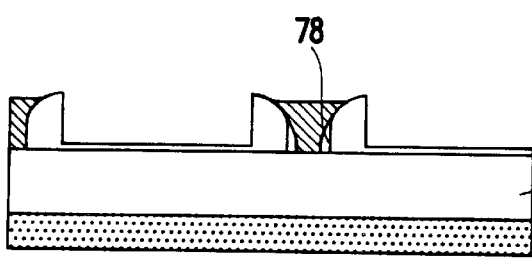
Figure 25:
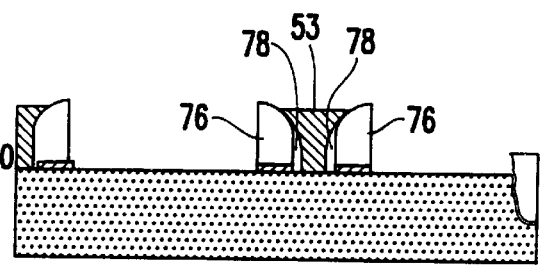
Figure 26:
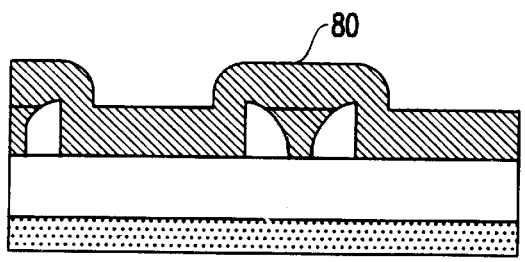
Figure 27:
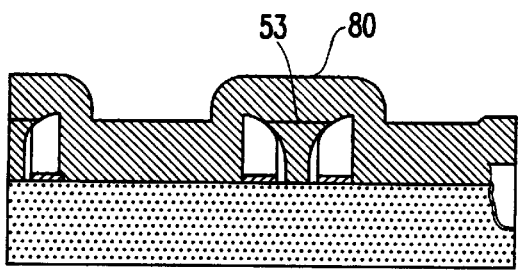
Figure 28:
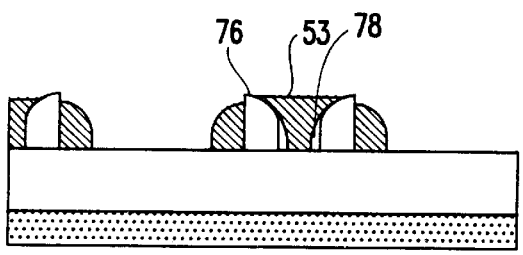
Figure 29:
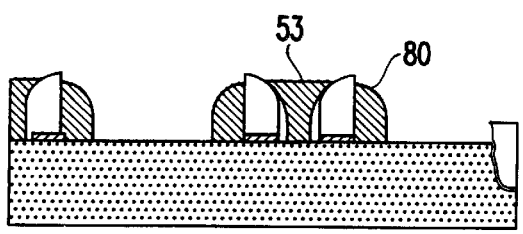
Figure 31:
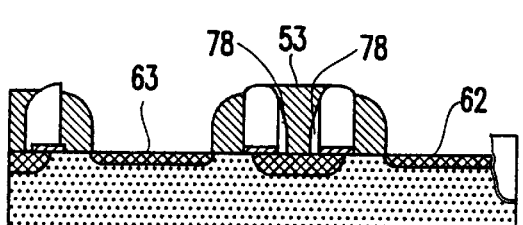

Subsequently, as shown in FIGS. 22 and 23, the nitride layer 68 may be stripped so as to expose the polysilicon layer 66 (FIG. 23) and the oxide layer 70 (FIG. 22). The exposed polysilicon layer 66, which is not covered by the contact plug 53 or the TEOS spacer 76, is subsequently etched as shown in FIG. 25. The TEOS spacer 76 and the plug 53 therefore act like a mask during this etch which is very selective to oxide. Oxide (not shown) is then grown and deposited over the structure to form an oxide layer preferably having a thickness of 160 Å. A polysilicon layer 80 is then deposited (approximately 2000 Å) over the structure as shown in FIGS. 26 and 27. The polysilicon layer 80 is then etched to form the polysilicon wordline spacers 56 as best shown in FIG. 1. Finally, the bitline/drain regions 62 and 63 are implanted as shown in FIG. 31.

Figure 32:
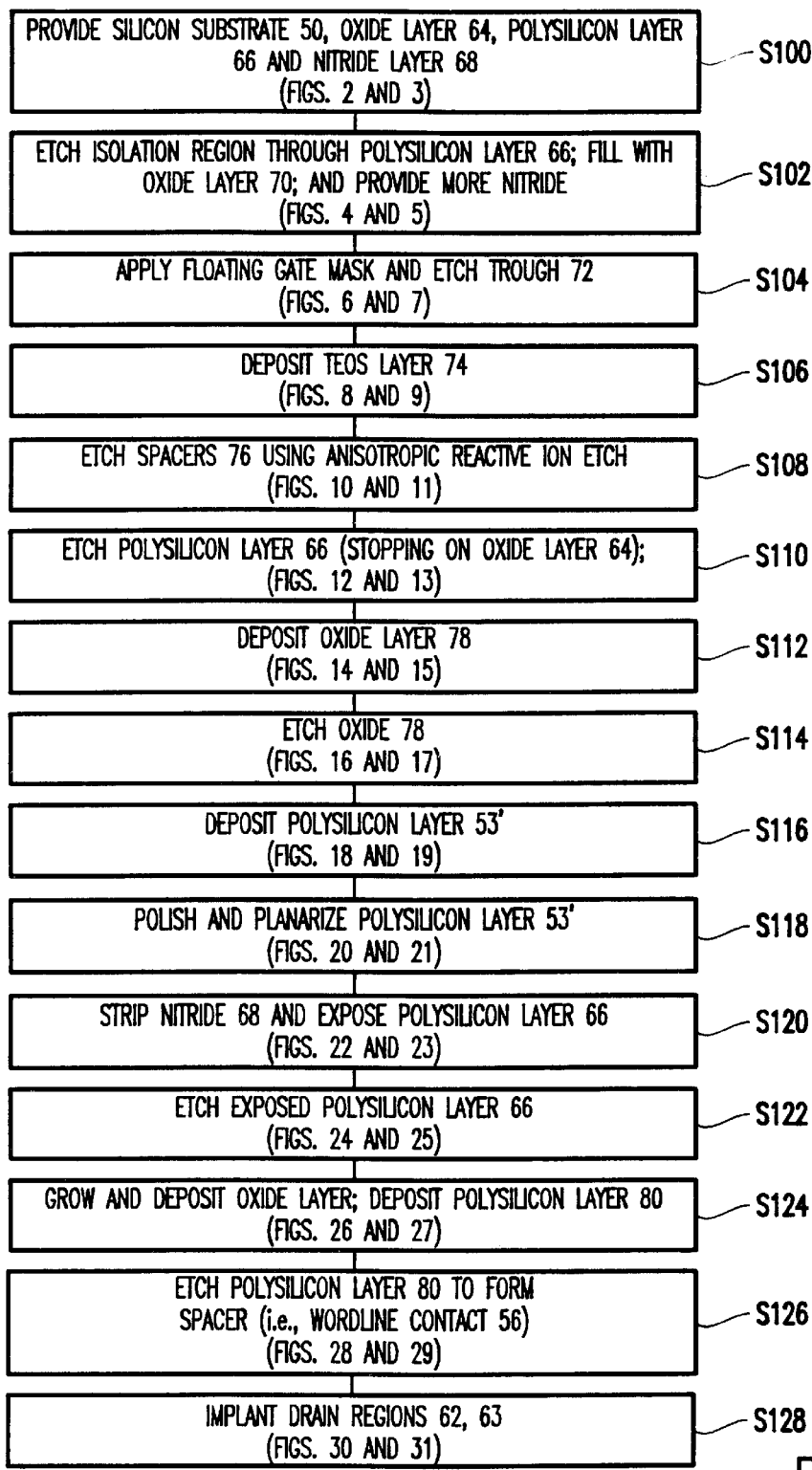
FIG. 32 is a flowchart showing one method of manufacturing the NVRAM cell according to the present invention.

FIG. 32 shows a flowchart of the method of forming the NVRAM cell according to the present invention. For illustration purposes, the flowchart includes corresponding figures. For example, in step S100, a silicon substrate 50, an oxide layer 64, a polysilicon layer 66 and a nitride layer 68 are initially provided. Then, the isolation region may be etched through the polysilicon layer 66 and into the substrate 50. An oxide layer 70 and nitride may then be added in the isolation region while more nitride can be added in the active region. In step S104, a floating gate mask may be used to etch the trough region 72 stopping on the oxide layer 70 in the isolation region and stopping on the polysilicon layer 66 in the active region. In step S106, the TEOS layer 74 is deposited over the structure. Then, in step S108, the TEOS 74 is etched using an anisotropic reactive ion etch to form the spacers 76 that correspond with the insulating spacers 55 shown in FIG. 1. Subsequently, in step S110, the polysilicon layer 66 is etched in the active region stopping on the oxide layer 64.

In step S112, the oxide layer 78 is deposited over the structure as shown in FIGS. 14 and 16. The oxide layer 78 is subsequently etched in step S114. A polysilicon layer 53' is then deposited in step S116 and as shown in FIGS. 18 and 19. This polysilicon layer 53' is later polished and planarized in step S118 (FIGS. 20 and 21). Subsequently, in step S120, the nitride layer 68 is stripped so as to expose the polysilicon layer 66 in the active region (FIG. 23) and to expose the oxide layer 70 in the isolation region (FIG. 22). The exposed polysilicon 66 is subsequently etched in step S122 and as shown in FIG. 25. A thin oxide layer and a polysilicon layer 80 are deposited in step S124. This polysilicon layer 80 is subsequently etched in step S126 to form the wordline contact 56. The oxide layer corresponds to the dielectric material 58 shown in FIG. 1. Finally, in step S128, the bitline/drain regions 62 and 63 are implanted.

As is well known, polysilicon spacer dimensions and profiles need to be well controlled to facilitate proper device design and ground rule integrity. The following discusses a method that yields a planar shallow trench isolation structure.

Figure 33:
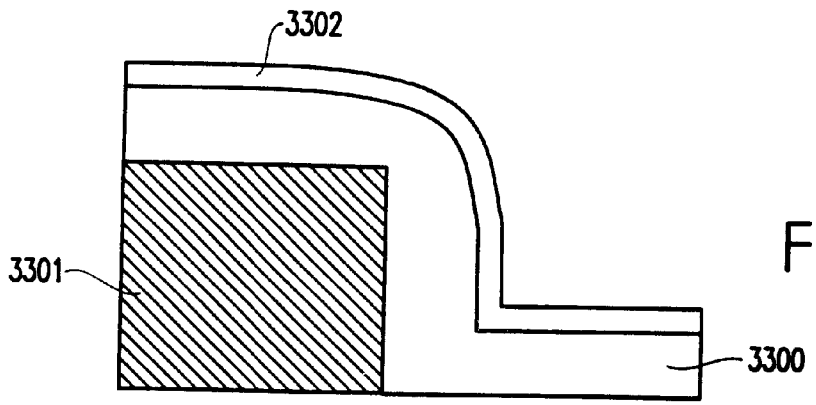
FIG. 33 is a schematic drawing of the polysilicon/oxide stacking for fabrication of a square spacer.
Figure 34:
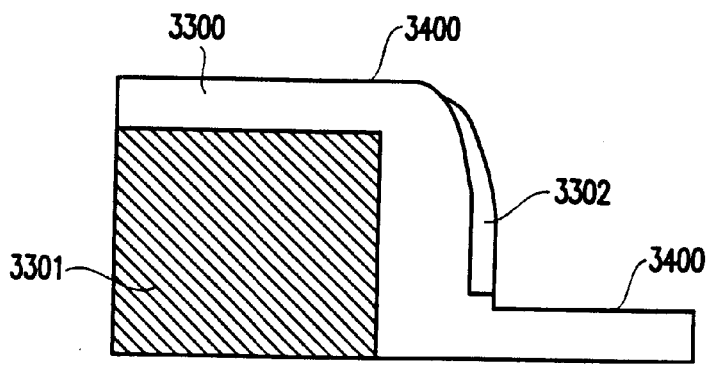
FIG. 34 is a schematic drawing of the etch breaking through the oxide on planar surfaces and forming an oxide spacer on the sidewall.
Figure 35:
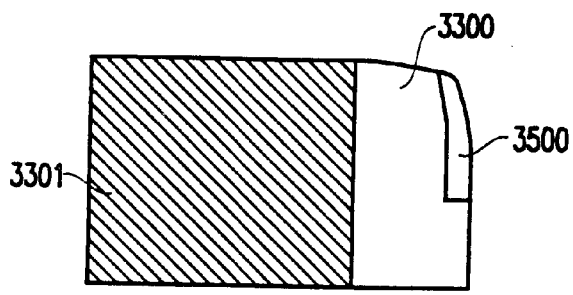
FIG. 35 is a schematic drawing of the oxide spacer showing the polysilicon etch at the corner producing a square spacer.

When the polysilicon layer 80 is etched in step S126 (FIGS. 28 and 29), the resulting spacers may have a rounded appearance. It is beneficial that these spacers are more of a square shape. FIG. 33 shows one embodiment of how to make polysilicon spacers with uniform dimensions. A polysilicon film 3300 (preferably 200 nm) intended to form the spacer may be conformally deposited over a mandrel 3301 which could be another gate or a sacrificial film. An oxide film 3302, preferably 20–40 nm, may then be conformally deposited over the polysilicon film 3300. An anisotropic etch chemistry may then be used, as shown in FIG. 34, to remove the oxide film 3302 from the planar top surface 3400 and then to begin to remove the polysilicon film 3300. The etch rate ratio of this etch is such that oxide 3302 on the planar surface 3400 is removed more slowly than the polysilicon 3300. Because the etch rate of any film using RIE processing is enhanced at exposed corners, the spacer 3500 projects from the corner of the polysilicon 3300 from the enhanced etch rate and preserves the vertical polysilicon 3300 etch profile as shown in FIG. 35. Accordingly, this processing shown in FIGS. 33–35 may be used to form square wordline spacers 56.

The following relates to the doping of the well regions in the silicon substrate. This discussion more particularly relates to implanting the source region which is formed in the trough region 72 as shown in FIGS. 8 and 9.

Figure 36:
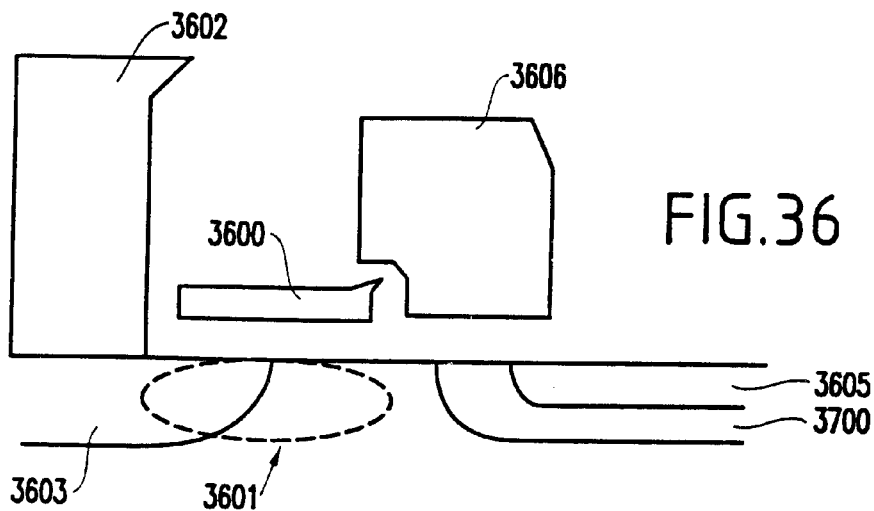
FIG. 36 is a schematic drawing of a single-well triple self-aligned memory cell having a halo.

Portions of a triple self-aligned split-gate NVRAM cell according to the present invention are shown in FIG. 36. Additional doping of the substrate will now be described. A floating gate 3600 may be patterned for the cell and its mirror cell. A floating gate well 3601 may be formed by subsequently implanting through the floating gate 3600. The floating gate 3600 of the cell and its mirror cell may be separated by etching through the floating gate 3600 down to the silicon 50. A source region 3603 may then be implanted into the floating gate hole in a conventional manner. Polysilicon 3602 may then be deposited into the floating gate hole (source plug) to form a floating gate injector point. A screen oxide may be grown on the injector tip and over the wordline channel. An oxide may be deposited over the injector tip and the wordline channel. The wordline spacer 3606 may be subsequently deposited and etched. The bitline junction 3605 and a bitline halo 3700 may then be implanted. The halo 3700 is preferably formed by implanting at an angle such that it forms under the wordline spacer 3606 and right next to the bitline/drain junction 3605.

The single well method of forming the triple self-aligned memory cell is advantageous because it reduces the process cost and complexity by eliminating the memory well mask, enhancing cell reliability by avoiding the need to implant into the injector tip insulator and subjecting the tip insulator to the application and removal of photoresist, and improves the manufacturability of the cell by reducing the sensitivity of the cell electrical characteristics to variations in the cell dimensions.

Another embodiment of the present invention will now be described. Referring to FIG. 37a-1 and FIG. 37a-2, there is shown a top plan view of a semiconductor substrate 10 having a first layer of insulating material 12, such as silicon dioxide deposited thereon. A first layer of polysilicon 14 is deposited on the first layer of isolating material 12. The semiconductor substrate 10 is preferably of P type and is well known in the art. The first insulating layer 12 is formed on the substrate 10 by well known techniques such as oxidation or deposition (e.g. chemical vapor deposition or CVD), forming a layer of silicon dioxide of approximately 80–90 Å in thickness. Similarly, the deposition and formation of the first polysilicon layer 14 on the first insulating layer 12 can be made by well known process such as Low Pressure CVD (or LPCVD) resulting in a layer of approximately 500–700Å thickness of polysilicon 14 on the first insulating layer 12. A silicon nitrite layer 18 of preferably 500Å is deposited by CVD. This layer 18 is used to define the active regions during isolation formation. Of course, all of the forgoing described parameters and the parameters described hereinafter, depend upon the design rules and the process technology generation. What is described herein is preferably for the 0.18 micron process. However. it will be understood by those skilled in the art that the present invention is not limited to any specific process technology generation, nor to any specific value in any of the process parameters described hereinafter.

Once the first insulating layer 12, the first polysilicon layer 14, and the silicon nitride 18 have been formed, suitable photo-resistant material 19 is applied on the silicon nitride layer 18 and a masking step is performed to etch the silicon nitride 18, the first polysilicon 14, and the underlying first insulating layer 12 in selective regions. Where the photo-resist 19 is not removed, they remain on top of the silicon nitride 18, the first polysilicon region 14 and the underlying insulating region 12. Where the photo-resist material 19 is removed, the silicon nitride 18, the polysilicon 14 and the underlying insulating material 12 are etched away in strips 16 formed in the Y direction or the column direction, as shown in FIG. 37b-1. As will be described, there are two embodiments in the formation of the isolation regions: LOCOS and STI. In the STI embodiment, the etching continues into the substrate 10 to a depth of approximately 2800 Å. The distance W between adjacent strips 16 can be as small as the smallest lithographic feature of the process used.

After the silicon nitride 18, the first polysilicon 14 and the first insulating layer 12 are etched away in strips 16, the regions or "grooves" 16 in the semiconductor substrate 10 are filled with an isolation material 20a or 20b, such as silicon dioxide. As shown in FIG. 37b-2, this can be the well known LOCOS process resulting in the local field oxide 20a or it can be shallow trench process (STI) resulting in silicono-dioxide being formed in the region 20b. Where the photo-resist 19 has not been removed, the semiconductor substrate 10 beneath the silicon nitride 18, the first polysilicon 14 and the underlying first insulating material 12 forms the active region. Thus, at this point, the substrate 10 has alternating strips of active regions and isolation regions with the isolation region being formed of either LOCOS 20a or shallow trench 20b. It should be noted that although FIG. 37b-2 shows the formation of both a LOCOS region 20a and a shallow trench region 20b, only one of either the LOCOS process 20a or the shallow trench 20b will be used. In the preferred embodiment, the shallow trench 20b will be foxed Shallow trench 20b is desirable because it can be formed planar with respect to the first polysilicon layer 14.

This structure is more compact than a structure formed by a non self-aligned method. A non self-aligned method of forming the structure shown in FIG. 37b, which is well known and is conventional, is as follows. Regions of isolation 20 are first formed in the substrate 10. This can be done by depositing a layer of silicon nitride on the substrate 10, depositing photo-resist, patterning the silicon nitride to expose selective portions of the substrate 10, and then oxidizing the exposed substrate 10 using either the LOCOS process or the STI process. Thereafter, the silicon nitride is removed, and a first layer of silicon dioxide 12 (to form the gate oxide) is deposited over the substrate 10. A first layer of polysilicon 14 is deposited over the gate oxide 12. The first layer of polysilicon 14 is then patterned and selective portions removed. Thus, the polysilicon 14 is not self-aligned with the regions of isolation 20, and a second masking step is required. Further, the additional masking step requires that the dimensions of the polysilicon 14 have an alignment tolerance with respect to the regions of isolation 20.

With the structure shown in FIG. 37b made using either the self-aligned method or the non self-aligned method, the structure is further processed as follows.

Figures 1, 37C:
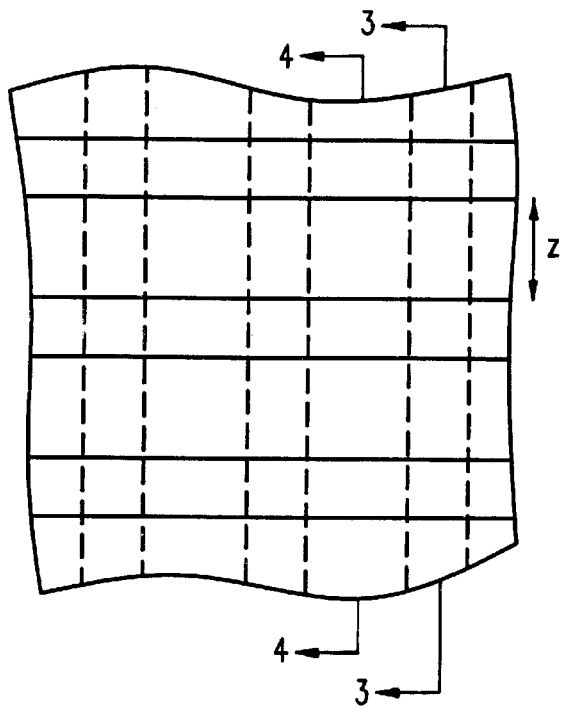
Figures 4, 37C:
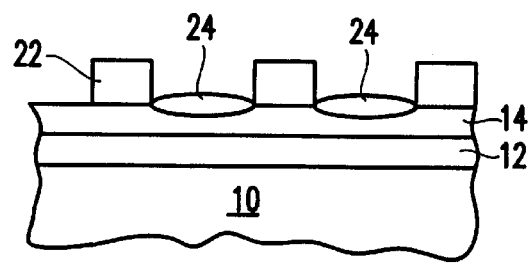
Figures 3, 37C:
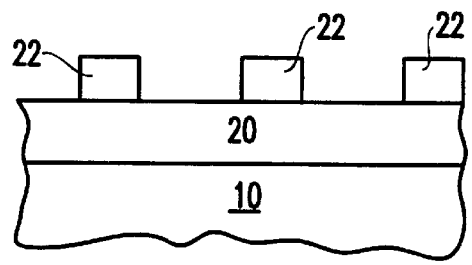

Referring to FIG. 37c-1, there is shown the top view of the next step in the process of the present invention. A masking layer 22, such as silicon nitride 22, is applied across the entire surface of the structure shown in FIG. 37b-1. A second masking operation is performed with a photo-resist applied on top of the silicon nitride 22. A mask in which strips are defined in the X or the row direction is applied. The distance Z between adjacent strips can be a size determined by the needs of the device to be fabricated. The proposed structure can contain three "features", i.e., two gates and one "space" within the distance Z. The photo-resist is removed in selective regions, i.e., strips in the row direction. The exposed masking material, or silicon nitride 22 is then etched resulting in the structure shown in FIG. 37c-1. In the process, each strip of silicon nitride 22 crosses over an active region in the semiconductor substrate 10 over which lies a first insulating layer 12 and a polysilicon layer 14, and over an isolation region in the semiconductor substrate 10, consisting of the shallow trench silicon dioxide 20. In addition, between each strip of silicon nitride 22 is a groove crossing over the shallow trench 20 and over an oxidized region of the first polysilicon 14, shown as 24 in FIG. 37c-4. The material 24 is the same silicon dioxide as that which is formed as the isolation region 20 in the shallow trench. The formation of the strips of silicon nitride 22 can be as follows.

The silicon nitride 22 is applied on the structure shown in FIG. 37b-1 by CVD in which a layer of approximately 3000 Å in thickness of silicon nitride 22 is formed on the structure.

Thereafter the silicon nitride 22 is etched selectively. The first polysilicon layer 14 and silicon dioxide regions 20a or 20b form etch stops thereby stopping the etching process. Finally, the exposed first polysilicon 14 is then oxidized to form the silicon dioxide 24.

Figures 4, 38A:
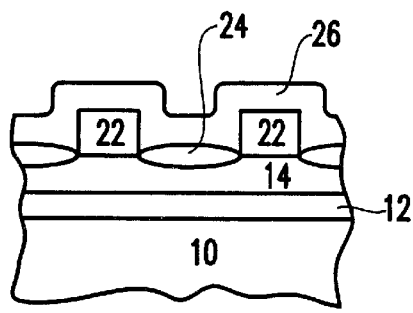

A second layer 26 of insulating material, such as silicon dioxide deposited from the decomposition of tetraethylorthosilicate (TEOS) is then applied on the entire surface of the structure shown in FIG. 37c-1. A cross sectional view of the layer 26 of TEOS applied on the entire structure is shown in FIG. 38a-4. The TEOS 26 can be applied using conventional processes such as CVD or conformal deposition to a thickness of approximately 2000–2500 Å.

Figures 4, 38B:
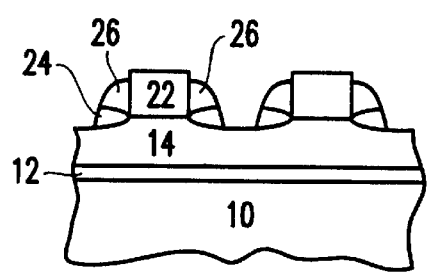

The layer of TEOS 26 is then anisotropically etched, by well known techniques, such as Reactive Ion Etch (RIE), until it no longer "covers" the strips of silicon nitride 22. As a result, strips of spacers 26 of TEOS 26 border and are adjacent to each strip of silicon nitride 22. This is shown in FIG. 38b-4. The anisotropic etching of the TEOS 26 continues until the etch stop silicon nitride 22 and the first polysilicon 14 are observed.

Thereafter, the etchant is changed to etch the first polysilicon 14. Anisotropic etching of the polysilicon 14 occurs until the first silicon dioxide 12 is observed and is used as the etch stop.

Suitable ion implantation is then made across the entire surface of the structure. Where the ions have sufficient energy to penetrate the first silicon dioxide region 12, they then form a first region 30 in the substrate 10. In all other regions, they are either absorbed into the TEOS 26, the isolation dielectric 20a or 20b, or into the silicon nitride 22, where they have no effect. The result is shown in FIG. 38c-4.

Figures 4, 38C:
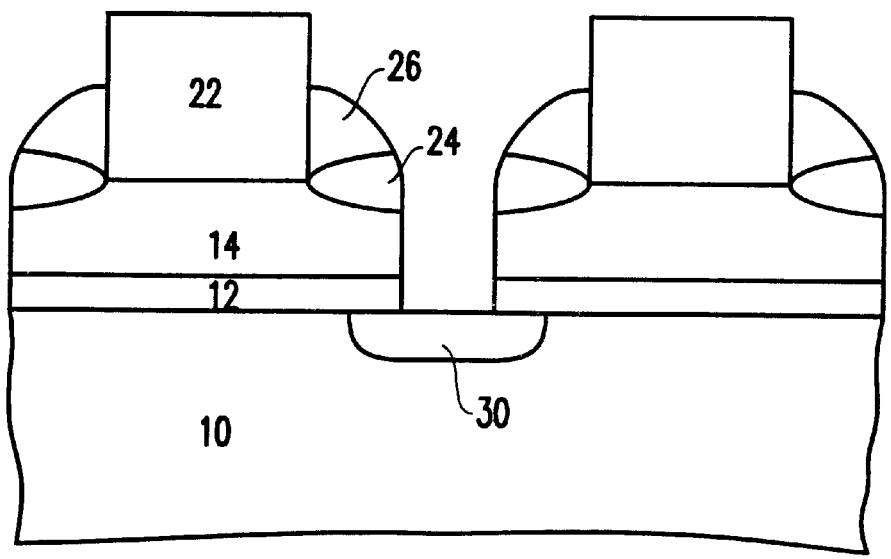

Oxidation of the entire structure shown in FIG. 38c-4 results in the exposed regions of the first polysilicon 14 being oxidized. Thus a layer of silicon dioxide layer 32 of approximately 300 Å is formed. A layer of insulating silicon dioxide is deposited over the entire structure. It should be noted that this "layer" of silicon dioxide 32, is formed in part from regions of TEOS 26 and silicon dioxide 24, and a "layer" 32 is shown for illustration purpose only.

Figures 4, 38D:
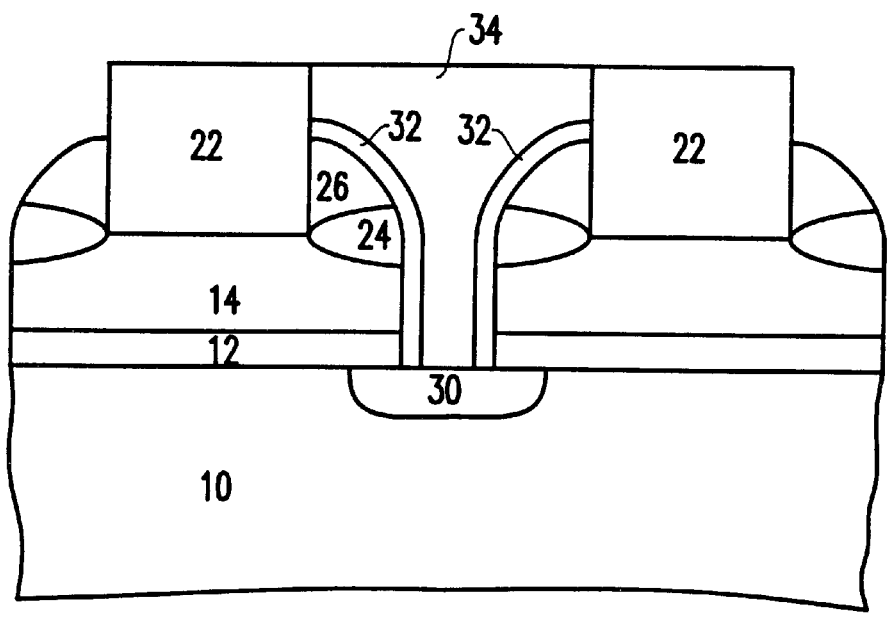

Anisotropic etching of the first layer of insulating material 12, silicon dioxide, is then performed until the substrate 10 is observe with that used as the etched stop. In the process of anisotropically etching the silicon dioxide 12, a portion of the layer 32 will also be etched. A second polysilicon deposition step (of approximately 3000 Å) is performed depositing in the "plug" or "hole" between adjacent strips of the TEOS spacers 26. The polysilicon material is removed from the silicon nitride 22 by a method of topographical selectivity. The preferred method is chem-mechanical polishing (CMP). The second polysilicon 34 forms ohmic contact with the first region 30 in the substrate 10. Polysilicon 34 may be doped and used as a diffusion source to supplement or replace the impurities forming the region 30. Polysilicon 34 may also be replaced by any suitable conductor such as tungsten, tungsten silicide, etc. The result is the structure shown in FIG. 38d-4. The structure is then oxidized forming a thin layer of silicon dioxide 36 on the second polysilicon plug 34.

Figures 4, 38E:
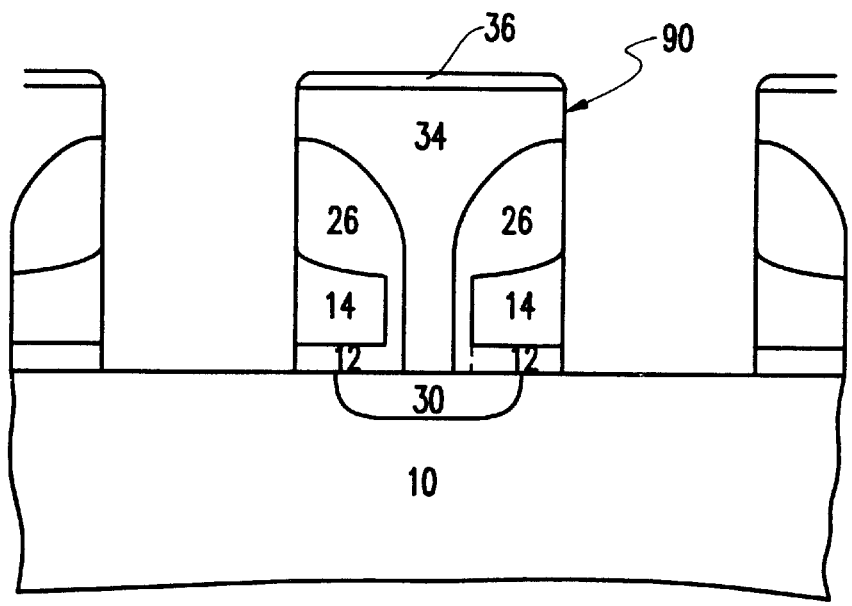

The silicon nitride 22 is then etched until the first polysilicon 14 is reached as the etch stop. Thereafter, the first polysilicon 14 is anisotropically etched until the first silicon dioxide 12 is reached as the etch stop. The formation of the "cap" 36 on the second polysilicon 34 prevents the second polysilicon 34 from being etched during this process. This is shown in FIG. 38e-4.

Figures 4, 38F:
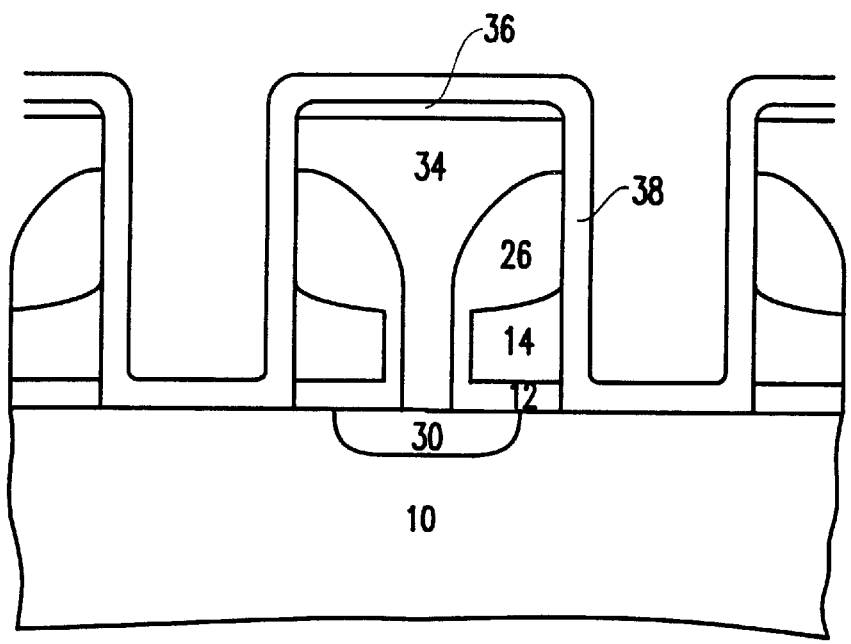

A thin layer of silicon dioxide 38 is then formed over the entire structure. The layer 36 is approximately 160–170 Å in thickness and can be formed by a combination of thermal oxidation and deposition. This is shown in FIGS. 38f-4.

Figures 4, 38G:
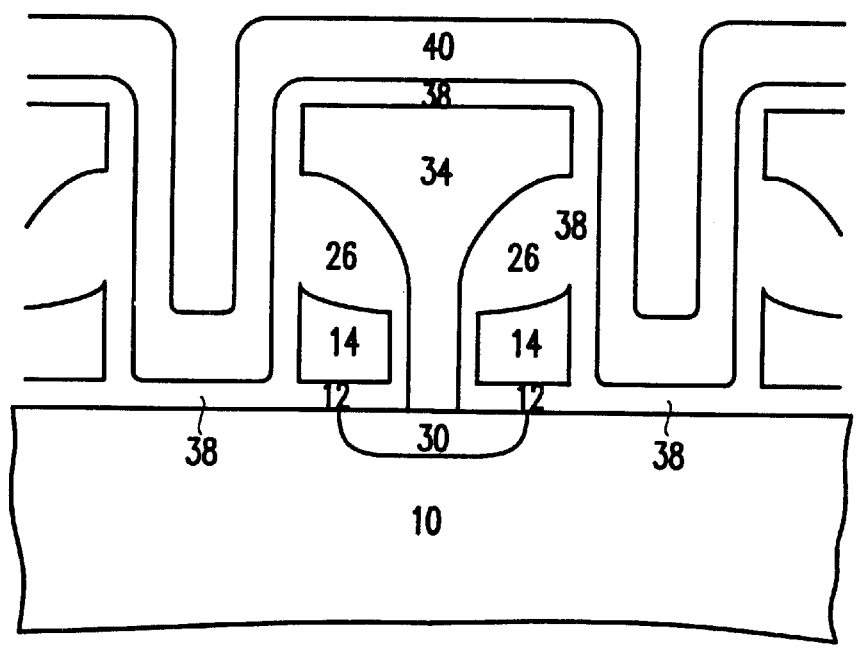

A third layer of polysilicon 40 is then deposited over the entire structure to a thickness of approximately 2000 Å. This shown in FIG. 38g-4. The third layer of polysilicon 40 can be deposited by LPCVD.

Figures 4, 38H:
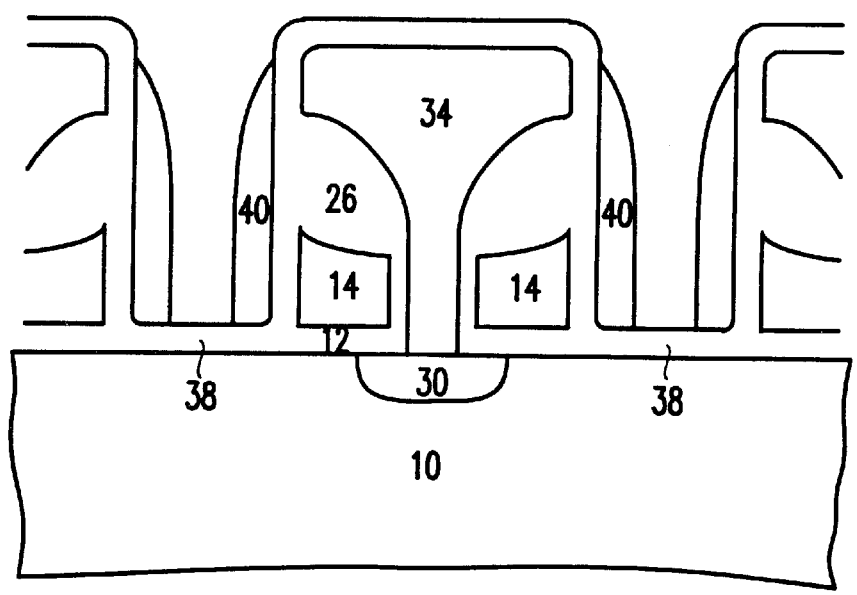

The third layer of polysilicon 40 is then anisotropically etched. The resulting structure is a plurality of spacers 40 in the row or X direction, parallel to the plug 34 in the row or X direction. The third layer of polysilicon 40 is etched until it "clears" the silicon dioxide 38 on "top" of the plug 34. Thus, the polysilicon spacers 40 to either side of the "plug" 34 are not connected to one another. The result is the structure shown in FIG. 38h-4.

Figures 4, 38I:
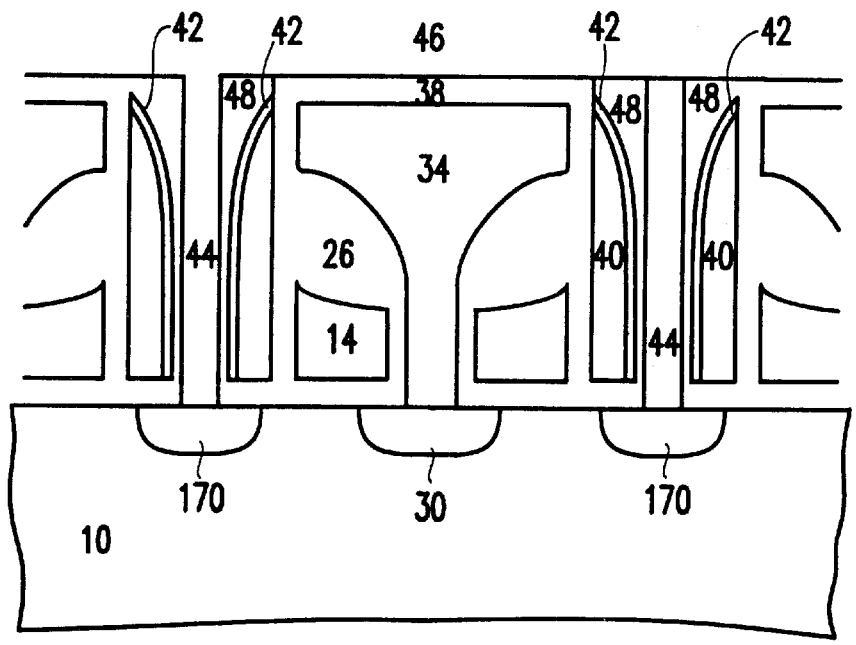

The spacers 40 are then oxidized to form a layer of silicon dioxide 42 covering all the exposed areas of the third polysilicon spacer 40. Ion implantation can be made at this point or prior to this oxidation step to form the second regions 170. The silicon dioxide 38 between adjacent polysilicon spacers 40 is then anisotropically etched until the substrate 10 is exposed with that used as the etch stop. A conventional contact 44 to metal 46 connection with a deposited dielectric 48 is formed to connect the second regions 170 to a common bit line 46. The dielectric 48 may also be silicon dioxide, the same material as the layer 42. The resulting structure is shown in FIG. 38I-4.

Figures 4, 38J:
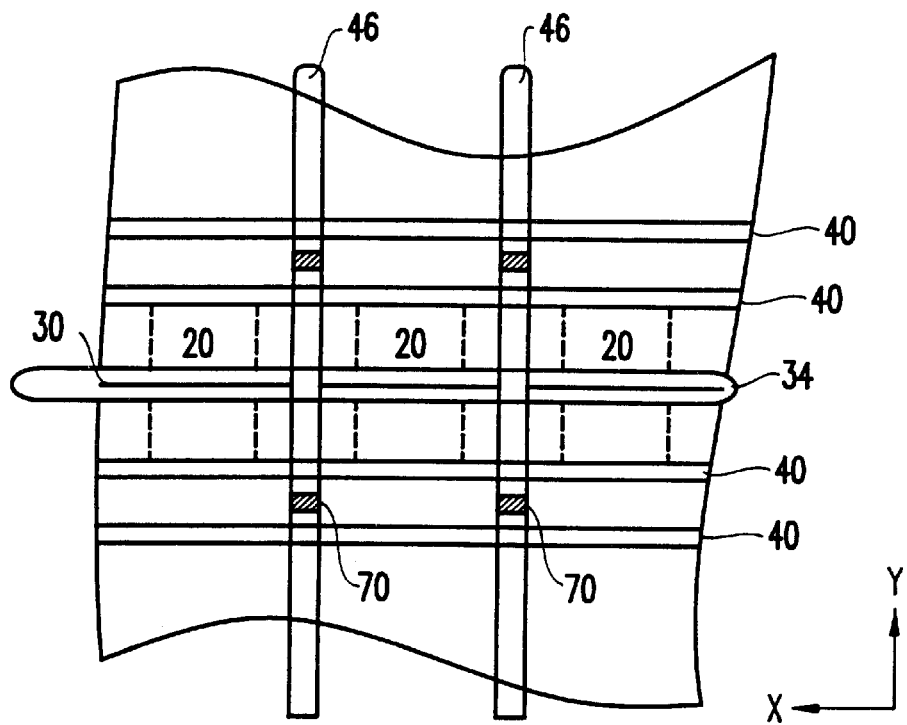

Referring to FIG. 38J-1, there is shown a top plan view of the resulting structure and the interconnection of the bit lines 44 to the second regions 170 and of the control lines 40 which run in the X or the row direction and finally the source lines 34 which connect to the first regions 30 within the substrate 10. Although the source lines 34 (as should be understood by those skilled in the art, the word "source" is interchangeable with the word "drain") makes contact with the substrate 10 in the entire row direction, i.e., contact with the active regions as well as the isolation regions, the source line 34 electrically connects only to the first regions 30 in the substrate 10. In addition, each first region 30 to which the "source" line 34 is connected and shared between two adjacent memory cells. Similarly, each second region 170 to which the bit line 44 is connected is shared between adjacent memory cells.

The result is a plurality of non-volatile memory cells of the split gate type having a floating gate 14, a control gate 40 which is a spacer which runs along the length of the row direction connecting to the control gates of other memory cells in the same row, a source line 34 which also runs along the row direction, connecting pairs of the first terminal 30 of the memory cells in the same row direction, and a bit line 44 which runs along the column or Y direction, connecting pairs of the second terminal 170 of the memory cells in the same column direction, the formation of the control gate, the floating gate, the source line, and the bit line, are all self-aligned. The non-volatile memory cell is of the split gate type having floating gate to control gate tunneling all as described in U.S. Pat. No. 5,572,054, whose disclosure is incorporated herein by reference with regard to the operation of such a non-volatile memory cell and an array formed thereby.

While the invention has been described in terms of preferred embodiments, those skilled in the art will recognize that the invention can be practiced with modification within the spirit and scope of the appended claims.

What is claimed is:

1. A non-volatile random access memory device comprising:
   a vertical source line contact;
   first vertical insulating spacers adjacent said vertical source line contact;
   a first floating gate adjacent one of said first vertical insulating spacers, wherein said one of said first vertical insulating spacers is between said first floating gate and said vertical source line contact;
   a second floating gate adjacent another of said first vertical insulating spacers, wherein said another of said first vertical insulating spacers is between said second floating gate and said vertical source line contact, and wherein said first floating gate is on an opposite side of said vertical source line contact from said second floating gate;
   second vertical insulating spacers adjacent said first floating gate and said second floating gate, wherein said second vertical insulating spacers are on an opposite side of said first floating gate and said second floating gate from said first vertical insulating spacers; and
   vertical control gates adjacent said second vertical insulating spacers, wherein said vertical control gates have an upper convex outer surface, and wherein said vertical control gates are on an opposite side of said second vertical insulating spacers from said first floating gate and said second floating gate, wherein said first floating gate and said second floating gate have an upper concave outer surface angled toward said vertical source line contact.

2. The device in claim 1, wherein said second vertical insulating spacers prevent said vertical control gates from horizontally overlapping said first floating gate and said second floating gate.

3. The device in claim 1, wherein said vertical control gates are vertically linear along a full length of contact with said second vertical insulating spacers.

4. The device in claim 1, wherein said second vertical insulating spacers align said vertical control gates with said first floating gate and said second floating gate, such that a horizontal overlap of said vertical control gates with said first floating gate and said second floating gate is avoided.

5. The device in claim 1, further comprising horizontal insulators above and below said first floating gate and said second floating gate.

6. The device in claim 5, wherein said first vertical insulating spacers, said second vertical insulating spacers and said horizontal insulators electrically insulate said first floating gate and said second floating gate from other structures within said device.

7. The device in claim 1, further comprising:

third vertical insulating spacers adjacent said vertical control gates, wherein said third vertical insulating spacers are on opposite sides of said vertical control gates from said second vertical insulating spacers; and vertical bitline contacts adjacent said third vertical insulating spacers.

8. A non-volatile random access memory device comprising:

a vertical source line contact;

floating split gates on opposite sides of said vertical source line contact, wherein said floating split gates have an upper concave outer surface angled toward said vertical source line contact; and vertical control gates on opposite sides of said floating split-gates from said vertical source line contact, wherein said vertical control gates have an upper convex outer surface, and wherein said vertical control gates occupy different vertical planes than said floating split-gates.

9. The device in claim 8, further comprising vertical insulating spacers between said floating split-gates and said vertical control gates, wherein said vertical insulating spacers prevent said vertical control gates from horizontally overlapping said floating split-gates.

10. Tile device in claim 8, further comprising vertical insulating spacers between said vertical control gates and said floating split-gates.

11. The device in claim 10, wherein said vertical control gates are vertically linear along a full length of contact with said vertical insulating spacers.

12. The device in claim 10, wherein said vertical insulating spacers align said vertical control gates with said floating split-gates, such that a horizontal overlap of said control gates with said floating split-gates is avoided.

13. The device in claim 8, further comprising vertical insulating spacers between said vertical source line contact and said floating split-gates.

14. The device in claim 8, fiber comprising horizontal insulators above and below said floating split-gates.

15. A non-volatile random access memory device comprising:

a vertical source line contact;

floating split-gates on opposite sides of said vertical source line contact, wherein said floating split gates have an upper concave outer surface angled toward said vertical source line contact;

vertical control gates on opposite sides of said floating split-gates from said vertical source line contact, wherein said vertical control gates have an upper convex outer surface; and vertical insulating spacers between said vertical control gates and said floating split-gates, wherein said vertical insulating spacers align said vertical control gates with said floating split-gates, and prevent said control gates from horizontally overlapping said floating split-gates.

16. The device in claim 15, wherein said vertical control gates are vertically linear along a full length of contact with said vertical insulating spacers.

17. The device in claim 15, further comprising second vertical insulating spacers between said vertical source line contact and said floating split-gates.

18. The device in claim 17, further comprising:

third vertical insulating spacers adjacent said vertical control gates, wherein said third vertical insulating spacers are on opposite sides of said vertical control gates from said vertical insulating spacers; and vertical bitline contacts adjacent said third vertical insulating spacers.

19. The device in claim 15, further comprising horizontal insulators above and below said floating split-gates.

* * * * *